United States Patent
Jenne et al.

(10) Patent No.: US 8,614,124 B2
(45) Date of Patent: Dec. 24, 2013

(54) SONOS ONO STACK SCALING

(75) Inventors: Fredrick B. Jenne, Mountain House, CA (US); Sagy Charel Levy, Zichron Yaakov (IL)

(73) Assignee: Cypress Semiconductor Corporation, San Jose, CA (US)

(*) Notice: Subject to any disclaimer, the term of this patent is extended or adjusted under 35 U.S.C. 154(b) by 1345 days.

(21) Appl. No.: 11/904,506

(22) Filed: Sep. 26, 2007

(65) Prior Publication Data

US 2008/0290400 A1    Nov. 27, 2008

Related U.S. Application Data

(60) Provisional application No. 60/940,384, filed on May 25, 2007.

(51) Int. Cl.
*H01L 21/336* (2006.01)

(52) U.S. Cl.
USPC ........... 438/257; 257/299; 257/321; 257/324; 257/325; 257/E21.209; 257/E29.309; 257/E29.042; 257/E29.179; 257/E29.304; 438/770; 438/261; 438/304

(58) Field of Classification Search
USPC .................. 257/299, 321, 324, 325, E21.209, 257/E29.309, E29.042, E29.179, E29.304; 438/257, 770, 261, 304
See application file for complete search history.

(56) References Cited

U.S. PATENT DOCUMENTS

| | | |
|---|---|---|
| 4,395,438 A | 7/1983 | Chiang |
| 4,543,707 A | 10/1985 | Ito et al. |
| 5,817,170 A | 10/1998 | Desu et al. |
| 5,972,765 A | 10/1999 | Clark et al. |
| 6,015,739 A | 1/2000 | Gardner et al. |
| 6,136,654 A | 10/2000 | Kraft et al. |
| 6,153,543 A | 11/2000 | Chesire et al. |
| 6,157,426 A | 12/2000 | Gu |
| 6,214,689 B1 | 4/2001 | Lim et al. |
| 6,218,700 B1 | 4/2001 | Papadas |
| 6,297,096 B1 | 10/2001 | Boaz |
| 6,321,134 B1 | 11/2001 | Henley et al. |
| 6,365,518 B1 | 4/2002 | Lee et al. |
| 6,433,383 B1 | 8/2002 | Ramsbey et al. |
| 6,444,521 B1 | 9/2002 | Chang et al. |
| 6,445,030 B1 | 9/2002 | Wu et al. |

(Continued)

OTHER PUBLICATIONS

Yang et al., Reliablity considerations in scaled SONOS nonvolatile memory devices, Solid-State Electronicss 43 (1999) 2025-2032.*

(Continued)

*Primary Examiner* — Meiya Li

(57) ABSTRACT

Scaling a nonvolatile trapped-charge memory device and the article made thereby. In an embodiment, scaling includes multiple oxidation and nitridation operations to provide a tunneling layer with a dielectric constant higher than that of a pure silicon dioxide tunneling layer but with a fewer hydrogen and nitrogen traps than a tunneling layer having nitrogen at the substrate interface. In an embodiment, scaling includes forming a charge trapping layer with a non-homogenous oxynitride stoichiometry. In one embodiment the charge trapping layer includes a silicon-rich, oxygen-rich layer and a silicon-rich, oxygen-lean oxynitride layer on the silicon-rich, oxygen-rich layer. In an embodiment, the method for scaling includes a dilute wet oxidation to density a deposited blocking oxide and to oxidize a portion of the silicon-rich, oxygen-lean oxynitride layer.

13 Claims, 11 Drawing Sheets

(56) References Cited

U.S. PATENT DOCUMENTS

| | | | |
|---|---|---|---|
| 6,461,899 B1 | 10/2002 | Kitakado et al. | |
| 6,518,113 B1 | 2/2003 | Buynoski | |
| 6,610,614 B2* | 8/2003 | Niimi et al. | 438/775 |
| 6,677,213 B1 | 1/2004 | Ramkumar et al. | |
| 6,709,928 B1 | 3/2004 | Jenne et al. | |
| 6,746,968 B1 | 6/2004 | Tseng et al. | |
| 6,768,856 B2 | 7/2004 | Akwani et al. | |
| 6,774,433 B2 | 8/2004 | Lee et al. | |
| 6,835,621 B2 | 12/2004 | Yoo et al. | |
| 6,958,511 B1 | 10/2005 | Halliyal et al. | |
| 7,018,868 B1 | 3/2006 | Yang et al. | |
| 7,033,957 B1 | 4/2006 | Shiraiwa et al. | |
| 7,112,486 B2 | 9/2006 | Cho et al. | |
| 7,115,469 B1 | 10/2006 | Halliyal et al. | |
| 7,450,423 B2 | 11/2008 | Lai et al. | |
| 7,482,236 B2 | 1/2009 | Lee et al. | |
| 8,008,713 B2 | 8/2011 | Dobuzinsky et al. | |
| 8,063,434 B1 | 11/2011 | Polishchuk et al. | |
| 8,067,284 B1 | 11/2011 | Levy | |
| 8,093,128 B2 | 1/2012 | Koutny, Jr. et al. | |
| 8,143,129 B2 | 3/2012 | Ramkumar et al. | |
| 8,283,261 B2 | 10/2012 | Ramkumar | |
| 8,318,608 B2 | 11/2012 | Ramkumar et al. | |
| 2002/0154878 A1 | 10/2002 | Akwani et al. | |
| 2003/0123307 A1 | 7/2003 | Lee et al. | |
| 2003/0124873 A1 | 7/2003 | Xing et al. | |
| 2003/0183869 A1* | 10/2003 | Crivelli et al. | 257/314 |
| 2004/0094793 A1 | 5/2004 | Noguchi et al. | |
| 2004/0104424 A1 | 6/2004 | Yamazaki | |
| 2004/0183122 A1 | 9/2004 | Mine et al. | |
| 2004/0207002 A1 | 10/2004 | Ryu et al. | |
| 2005/0026637 A1 | 2/2005 | Fischer et al. | |
| 2005/0070126 A1 | 3/2005 | Senzaki | |
| 2005/0186741 A1 | 8/2005 | Roizin et al. | |
| 2005/0236679 A1 | 10/2005 | Hori et al. | |
| 2005/0245034 A1* | 11/2005 | Fukuda et al. | 438/285 |
| 2005/0266637 A1 | 12/2005 | Wang | |
| 2005/0275010 A1 | 12/2005 | Chen et al. | |
| 2006/0065919 A1* | 3/2006 | Fujiwara | 257/315 |
| 2006/0081331 A1 | 4/2006 | Campian | |
| 2006/0111805 A1 | 5/2006 | Yokoyama et al. | |
| 2006/0113586 A1* | 6/2006 | Wang | 257/324 |
| 2006/0113627 A1 | 6/2006 | Chen et al. | |
| 2006/0192248 A1 | 8/2006 | Wang | |
| 2006/0228899 A1 | 10/2006 | Nansei et al. | |
| 2006/0261401 A1 | 11/2006 | Bhattacharyya | |
| 2007/0048916 A1 | 3/2007 | Suzuki et al. | |
| 2007/0051306 A1 | 3/2007 | Ivanov et al. | |
| 2007/0121380 A1 | 5/2007 | Thomas | |
| 2007/0210371 A1 | 9/2007 | Hisamoto et al. | |
| 2007/0272971 A1 | 11/2007 | Lee et al. | |
| 2008/0029399 A1 | 2/2008 | Tomita et al. | |
| 2008/0048237 A1 | 2/2008 | Iwata | |
| 2008/0146042 A1 | 6/2008 | Kostamo et al. | |
| 2008/0258203 A1 | 10/2008 | Happ et al. | |
| 2008/0290398 A1 | 11/2008 | Polishchuk et al. | |
| 2008/0293207 A1 | 11/2008 | Koutny, Jr. et al. | |
| 2008/0293255 A1 | 11/2008 | Ramkumar | |
| 2008/0296664 A1 | 12/2008 | Ramkumar et al. | |
| 2009/0011609 A1 | 1/2009 | Ramkumar et al. | |
| 2009/0179253 A1 | 7/2009 | Levy et al. | |
| 2010/0252877 A1 | 10/2010 | Nakanishi et al. | |

OTHER PUBLICATIONS

PCT International Search Report and Written Opinion of the International Searching Authority, PCT/US07/20966 filed Sep. 28, 2007, mailed Apr. 21, 2008.

Chen, Tung-Sheng, et al., "Performance Improvement of SONOS Memory by Bandgap Engineering of Charge-Trapping Layer", Chen, Tung-Sheng, et al., "Performance Improvement of SONOS Memory by Bandgap Engineering of Charge-Trapping Layer," IEEE Electron Device Letters, Apr. 2004, pp. 205-207, vol. 25, No. 4.

Lue, Hang-Ting, et al., "Be-SONOS: A Bandgap Engineered SONOS With Excellent Performance and Reliability", Lue, Hang-Ting, et al., "Be-SONOS: A Bandgap Engineered SONOS With Excellent Performance and Reliability," IEEE, 2005, 4 pgs.

Lue, Hang-Ting, et al., "Reliability Model of Bandgap Engineered SONOS (Be-SONOS)", Lue, Hang-Ting, et al., "Reliability Model of Bandgap Engineered SONOS (Be-SONOS)," IEEE, 2006, 4 pgs.

Wang, Szu-Yu, et al., "Reliability and Processing Effects of Bandgap Engineered SONOS (Be-SONOS) Flash Memory", Wang, Szu-Yu, et al., "Reliability and Processing Effects of Bandgap Engineered SONOS (Be-SONOS) Flash Memory," 2007 IEEE International Reliability Symposium, Apr. 18, 2007, 5 pgs.

Wu, Kuo-Hong, et al., "SONOS Device With Tapered Bandgap Nitride Layer", Wu, Kuo-Hong, et al., "SONOS Device With Tapered Bandgap Nitride Layer," IEEE Transactions on Electron Devices, May 2005, pp. 987-992, vol. 52, No. 5.

Office Action Receive for Application No. 10-2007-7001931 (PM04006KR) dated Dec. 26, 2012; 6 pages.

U.S. Appl. No. 13/539,461: "Sonos Ono Stack Scaling," Fredrick Jenne, filed on Jul. 1, 2012; 91 pages.

International Search Report for International Application No. PCT/US07/20966 dated Apr. 21, 2008; 2 pages.

Written Opinion of the International Searching Authority for International Application No. PCT/US07/20966 mailed Apr. 21, 2008; 1 pages.

* cited by examiner

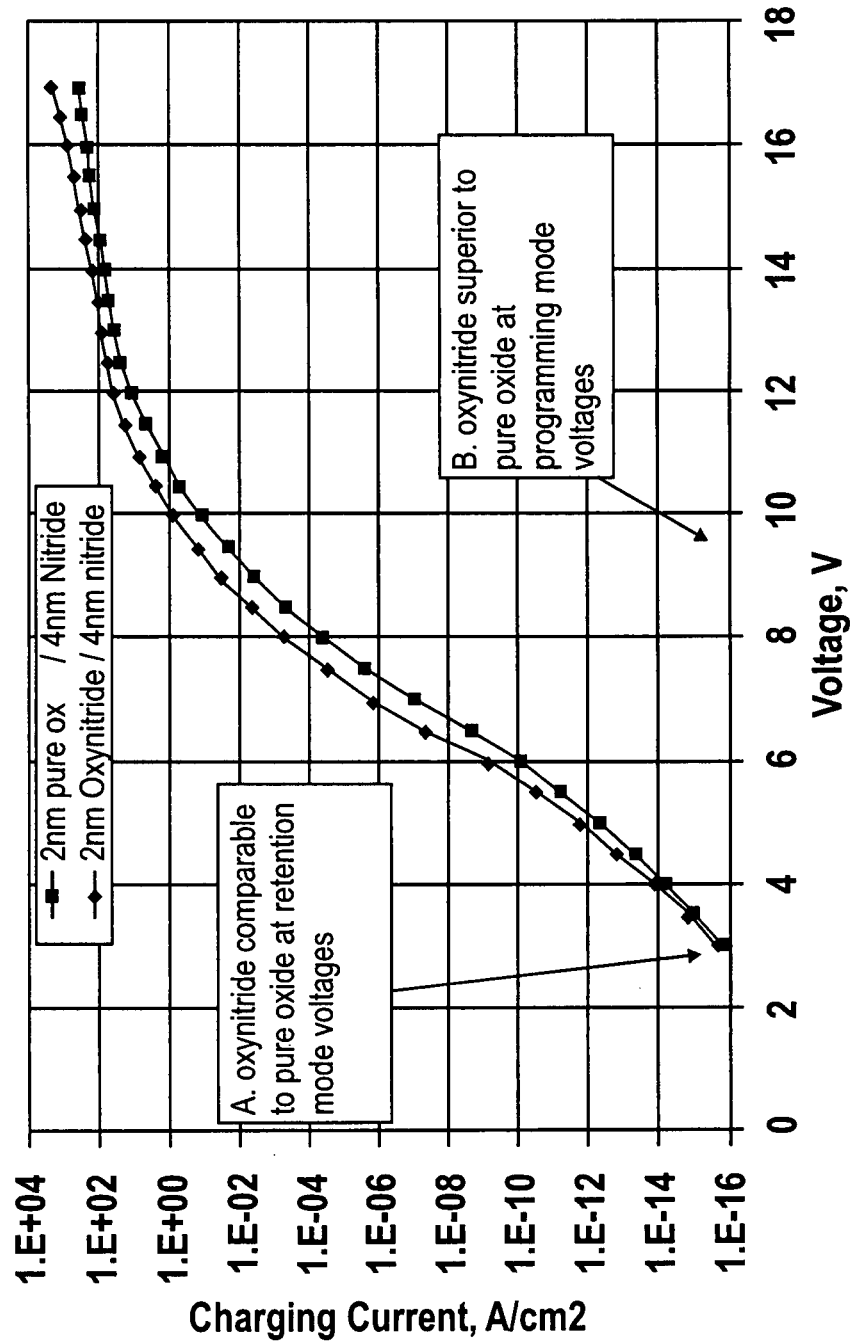

SONOS ONO STACK SCALING

CROSS REFERENCE TO RELATED APPLICATIONS

This application claims the benefit of U.S. Provisional Application No. 60/940,384, filed May 25, 2007, hereby incorporated by reference.

TECHNICAL FIELD

Embodiments of the present invention relate to the electronics manufacturing industry and more particularly to fabrication of nonvolatile trapped-charge memory devices.

BACKGROUND

FIG. 1 is a partial cross-sectional view of an intermediate structure for a semiconductor device 100 having a semiconductor-oxide-nitride-oxide-semiconductor (SONOS) gate stack 102 including a conventional oxide-nitride-oxide (ONO) stack 104 formed over a surface 106 of a semiconductor substrate 108 according to a conventional method. The device 100 typically further includes one or more diffusion regions 110, such as source and drain regions, aligned to the gate stack and separated by a channel region 112. The SONOS gate stack 102 includes a poly-silicon (poly) gate layer 114 formed upon and in contact with the ONO stack 104. The poly gate 114 is separated or electrically isolated from the substrate 108 by the ONO stack 104. The ONO stack 104 generally includes a silicon oxide tunneling layer 116, a silicon nitride charge trapping layer 118 which serves as a charge storing or memory layer for the device 100, and a silicon oxide blocking layer 120 overlying the charge trapping layer 118.

Such SONOS-type transistors are useful for non-volatile memory (NVM). The charge trapping layer stores charge to provide non-volatility. To program (i.e. write to) the n-channel SONOS-type device, a positive voltage is applied to the control gate ($V_{CG}$) while the source, body and drain are grounded. An energy band diagram, trapped charge distribution and trap density distribution of a conventional n-channel SONOS device having a channel 212, oxide tunneling layer 216, nitride memory layer 218 and oxide blocking layer 220 during programming is depicted in FIG. 2. As shown, the positive $V_{CG}$ produces a field across the SONOS stack resulting in some negative charge at the conduction band energy level in the buried channel of silicon substrate channel to undergo Fowler-Nordheim tunneling (FNT) through the tunneling layer and into the charge trapping layer. The electrons are stored in traps having mid gap energy levels in the charge trapping nitride. As illustrated, the trap density distribution is substantially uniform throughout the charge trapping layer. As further shown, under bias, the trapped charge distribution is such that the majority of trapped charge is in the portion of the charge trapping layer (i.e. memory layer) proximate to the blocking oxide. To erase the n-channel SONOS device, a negative voltage is applied to the control gate 314. An energy band diagram showing the channel 312, oxide tunneling layer 316, nitride memory layer 318 and oxide blocking layer 320 during erasing is depicted in FIG. 3. As shown, the negative $V_{CG}$ produces a field across the SONOS stack attracting hole tunneling charge through the tunneling layer and into the charge trapping layer.

SONOS-type devices are gaining in popularity for high density memory applications, such as embedded NVM. It is known in the industry that uniform channel Fowler-Nordheim tunneling (FNT) and/or direct tunneling (DT) for program and erase result in improved reliability over other methods. A combination of FNT and DT is referred to here and is referred to as modified Fowler-Nordheim tunneling (MFNT) Currently, conventional SONOS operate in the 10 V range for MFNT. However, an advantage of SONOS over other NVM devices is voltage scalability. It has been theorized, with proper scaling, there exists potential in SONOS to achieve a memory technology operable in the 5 volt (V) range, rather than the 10 V range of conventional SONOS-type devices or 12 V-15 V range of conventional flash technology. SONOS-type devices operable at low voltages (approaching 5 V) are advantageously compatible with low voltage CMOS. Alternatively, faster programming or erasing may be possible at a particular voltage for a scaled device. However, successful scaling of SONOS-type devices is non-trivial. For example, FIG. 4 depicts programming and erase times for a conventional SONOS device employing a conventional ONO stack comprised of a 10 nm thick silicon dioxide blocking layer, a 7 nm thick silicon nitride charge trapping layer, and a 3 nm thick silicon dioxide tunneling layer. As shown, the programming/erase time increases dramatically when $V_{CG}$ is scaled down. Generally, program/erase times less than 1 ms are desirable for embedded memory applications. However, such 1 millisecond (ms) program/erase times may be achieved in the conventional SONOS stack only with a $V_{CG}$ of +/−10 V. Conventional SONOS program/erase times extend to 100 ms or more when $V_{CG}$ is reduced to approximately +/−9 V.

Furthermore, reducing the programming voltage results in a reduction of the erase or program window (i.e. memory window). This is because the electric field is across the ONO stack is reduced if the equivalent oxide thickness (EOT) of the entire ONO stack is not scaled down as the voltage is reduced. Reducing the EOT of the stack is non-trivial because reducing the tunneling layer thickness to allow the same initial erase level at a lower applied voltage ($V_{CG}$) can result in a detrimental increase in the erase and program decay rate Similarly, if the charge trapping layer thickness is reduced, the charge centroid is placed closer to the substrate, increasing charge loss to the substrate. Finally, when the blocking oxide thickness is scaled down, the electron reverse injection from the control gate is increased, causing damage to the ONO stack and data retention loss. Reverse injection is manifested as further shown in FIG. 4, where the FNT erase reaches "saturation." This occurs when electrons are back streamed from the gate into the memory layer faster than they can be removed via hole transport across the tunnel oxide. Accordingly, there remains a need to scale the ONO stack of a SONOS device in a manner capable of providing a device operable at a lower program/erase voltage.

BRIEF DESCRIPTION OF THE DRAWINGS

Embodiments of the present invention are illustrated by way of example, and not limitation, in the figures of the accompanying drawings in which:

FIG. 7A illustrates a graph depicting simulation showing reduction in programming voltage attributable to a nitridized oxide tunneling layer in accordance with an embodiment of the present invention.

DETAILED DESCRIPTION

Figure 1:
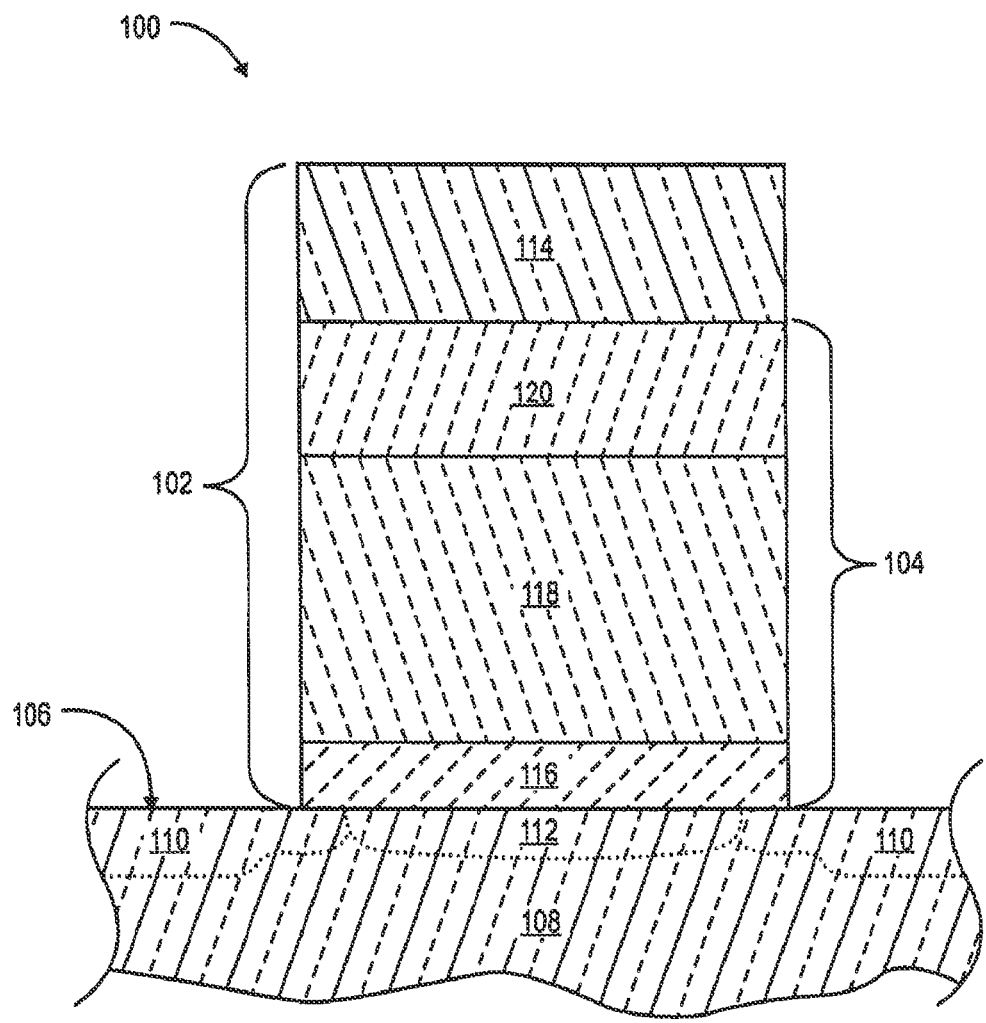
FIG. 1 illustrates a cross sectional view of an intermediate structure for a conventional SONOS device.
Figure 2:
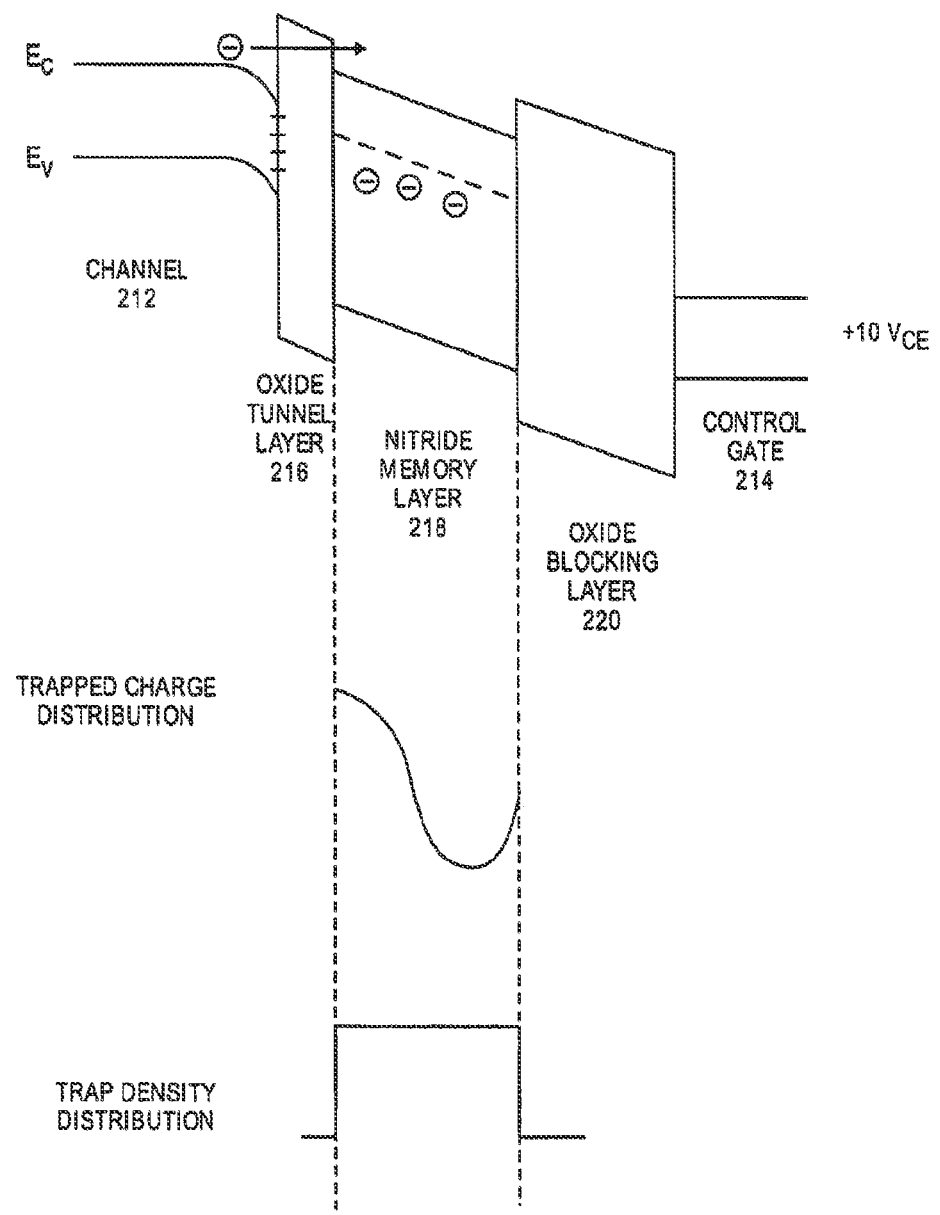
FIG. 2 depicts an energy band diagram, trapped charge distribution and trap density distribution of a conventional SONOS device during program.
Figure 3:
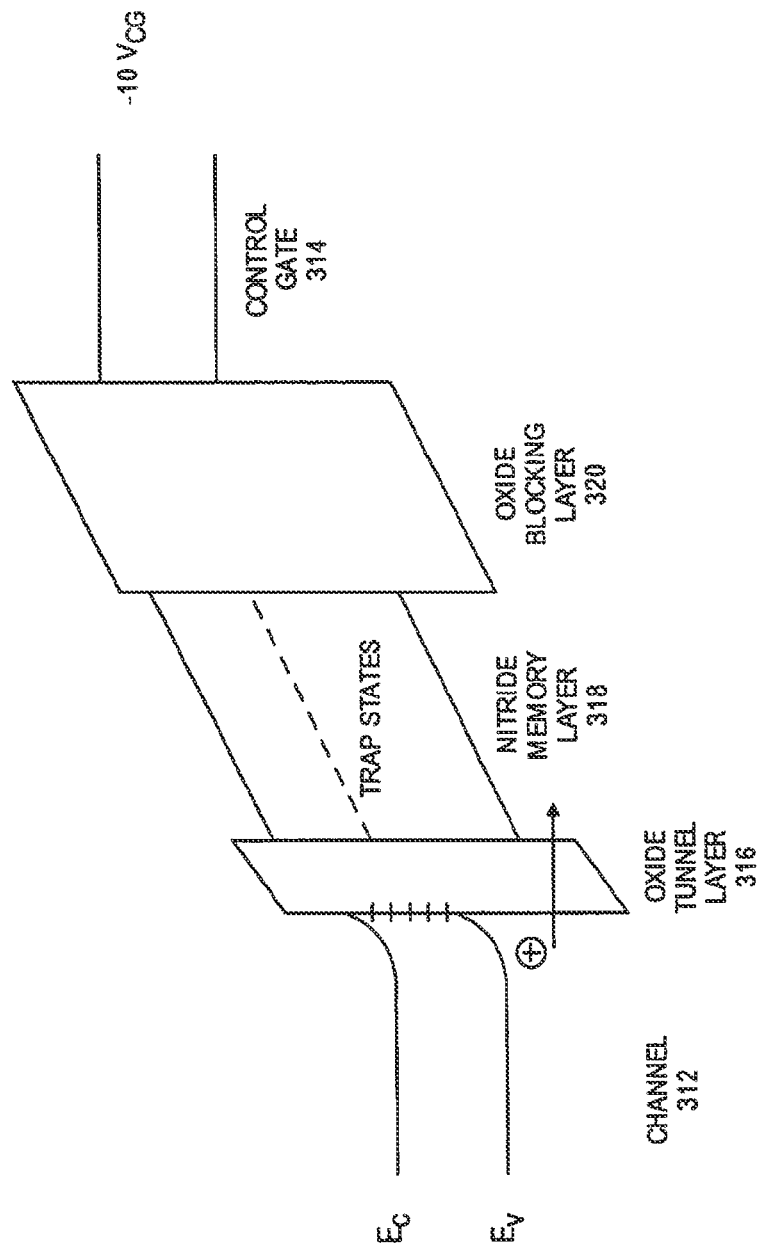
FIG. 3 depicts an energy band diagram of a conventional SONOS device during erase.
Figure 4:
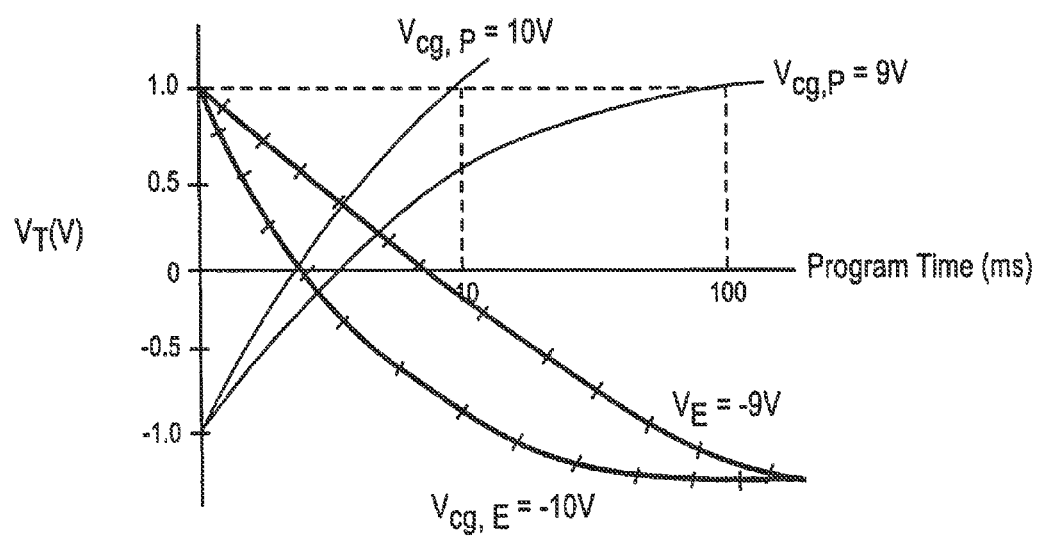
FIG. 4 depicts programming and erase times for a conventional SONOS device employing a conventional ONO stack.

Embodiments of scaling a nonvolatile trapped-charge memory device are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Certain embodiments of the present invention include a scaled SONOS-type device. In particular embodiments of the present invention, the tunneling layer, charge trapping layer and blocking layer are modified to scale the SONOS-type device. In particular embodiments, the scaled SONOS device is operable at programming and erase voltages below +/−10 V. In certain such embodiments, the scaled SONOS device is operated with an erase voltage between −5 V and −9V, and preferably between −5 V and −7 V, to provide an initial erase voltage threshold level (VTE) of −1 to −3 V and preferably −2 to −3 after a 1 ms-10 ms pulse when operated at temperature of between −40 to 95 degrees Celsius (° C.). In other specific embodiments, the SONOS-type device is operated with a programming voltage between 5 V and 9V, and preferably between 5 V and 7 V, to provide an initial program voltage threshold level (VTP) of 1 V to 3 V, preferably 2 V to 3 V, after a 1 ms to 10 ms, preferably 5 ms, programming pulse. These exemplary scaled SONOS devices providing an end of life (EOL) memory window of between 1 V and 2 V after 20 years at 85° C. and at least 10,000 write/erase cycles, preferably 100,000 cycles.

In certain embodiments, a conventional pure oxygen (oxide) tunneling layer is replaced with a nitridized oxide having a particular nitrogen concentration profile to reduce the equivalent oxide thickness of the tunneling layer relative to the pure oxygen tunneling layer while retaining low interface trap density. This enables reducing (scaling) the programming/erase voltages while providing an erase voltage threshold level (VTP/VTE) as good or better than a conventional, non-scaled device. In particular other embodiments, the conventional charge trapping layer of nitride is replaced with a multi-layer oxynitride film having at least a top and bottom layer of distinct stoichiometry. In one such embodiment, the multi-layer oxynitride includes a silicon-rich, oxygen-lean top layer to locate and confine the centroid of charge away from the tunnel oxide layer, thereby locally increasing trap density within the charge trapping layer. In particular other embodiments, the conventional blocking layer of high temperature oxide (HTO) is replaced with a reoxidized blocking layer to density the blocking oxide and thereby reduce the memory decay rate with scaling. Such embodiments provide sufficient net charge for an adequate memory window while also reducing trap assisted tunneling to improve or maintain programming and erase threshold voltages (VTP/VTE) when the SONOS device is operated at a reduced program/erase voltage.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

In accordance with one embodiment of the present invention, the nonvolatile trapped-charge memory device is a SONOS-type device wherein a charge-trapping layer is an insulator layer, such as a nitride. In another embodiment, the nonvolatile trapped-charge memory device is a Flash-type device wherein the charge-trapping layer is a conductor layer or a semiconductor layer, such as poly-silicon. Nonvolatile trapped-charge memory devices employing the nitridized oxide tunneling layer may enable a lower programming or erase voltage while providing an erase voltage threshold level (VTP/VTE) as good as or better than a conventional device.

Figure 5:
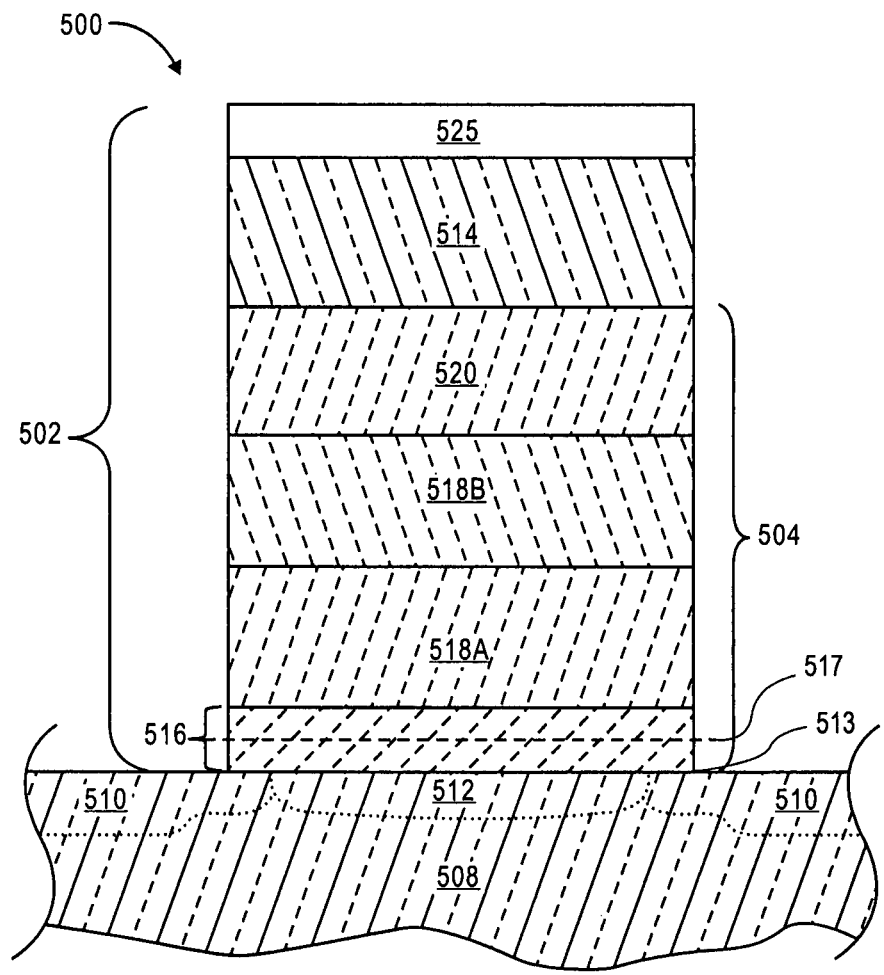
FIG. 5 illustrates a cross-sectional side view of a portion of a scaled nonvolatile trapped-charge memory device having a scaled ONO structure including a nitridized oxide tunneling layer, a multi-layer oxynitride charge trapping layer and a densified blocking layer according to an embodiment of the present invention.

FIG. 5 illustrates a cross-sectional side view of an intermediate structure of a SONOS-type device 500 having a scaled ONO stack according to an embodiment of the present invention. It should be appreciated that various other SONOS embodiments disclosed herein may also be employed to produce a scaled ONO stack beyond the specific embodiment depicted in FIG. 5, but nonetheless also operable at a reduced program/erase voltage. Thus, while the features of FIG. 5 may be referenced throughout the description, the present invention is not limited to this particular embodiment.

In the specific embodiment shown in FIG. 5, the SONOS-type device 500 includes a SONOS gate stack 502 including an ONO stack 504 formed over a surface 513 of a substrate 508. SONOS-type device 500 further includes one or more source and drain regions 510, aligned to the gate stack 502 and separated by a channel region 512. Generally, the scaled SONOS gate stack 502 includes a gate layer 514 formed upon and in contact with the scaled ONO stack 504 and a portion of the substrate 508. The gate layer 514 is separated or electrically isolated from the substrate 508 by the scaled ONO stack 504.

In one embodiment, substrate 508 is a bulk substrate comprised of a single crystal of a material which may include, but is not limited to, silicon, germanium, silicon-germanium or a III-V compound semiconductor material. In another embodiment, substrate 508 is comprised of a bulk layer with a top epitaxial layer. In a specific embodiment, the bulk layer is comprised of a single crystal of a material which may include, but is not limited to, silicon, germanium, silicon/germanium, a III-v compound semiconductor material and quartz, while the top epitaxial layer is comprised of a single crystal layer which may include, but is not limited to, silicon, germanium, silicon/germanium and a III-V compound semiconductor material. In another embodiment, substrate 508 is comprised of a top epitaxial layer on a middle insulator layer which is above a lower bulk layer. The top epitaxial layer is comprised of a single crystal layer which may include, but is not limited to, silicon (i.e. to form a silicon-on-insulator (SOD semiconductor substrate), germanium, silicon/germanium and a III-V compound semiconductor material. The insulator layer is comprised of a material which may include, but is not limited to, silicon dioxide, silicon nitride and silicon oxy-nitride. The lower bulk layer is comprised of a single crystal which may include, but is not limited to, silicon, germanium, silicon/germanium, a III-V compound semiconductor material and quartz. Substrate 508 and, hence, the channel region 512 between the source and drain regions 510, may comprise dopant impurity atoms. In a specific embodiment, the channel region is doped P-type and, in an alternative embodiment, the channel region is doped N-type.

Source and drain regions 510 in substrate 508 may be any regions having opposite conductivity to the channel region 512. For example, in accordance with an embodiment of the present invention, source and drain regions 510 are N-type doped while channel region 512 is P-type doped. In one embodiment, substrate 508 is comprised of boron-doped single-crystal silicon having a boron concentration in the range of $1 \times 10^{15}$-$1 \times 10^{19}$ atoms/cm$^3$. Source and drain regions 510 are comprised of phosphorous- or arsenic-doped regions having a concentration of N-type dopants in the range of $5 \times 10^{16}$-$5 \times 10^{19}$ atoms/cm$^3$. In a specific embodiment, source and drain regions 510 have a depth in substrate 508 in the range of 80-200 nanometers. In accordance with an alternative embodiment of the present invention, source and drain regions 510 are P-type doped while the channel region of substrate 508 is N-type doped.

The SONOS-type device 500 further includes, over channel region 512, a gate stack 502 including an ONO stack 504, a gate layer 514 and a gate cap layer 525. The ONO stack 504 further includes tunneling layer 516, a charge trapping layer 518 and a blocking layer 520.

In an embodiment, the tunneling layer 516 includes a nitridized oxide. Because programming and erase voltages produce large electric fields across a tunneling layer, on the order of 10 MV/cm, the program/erase tunneling current is more a function of the tunneling layer barrier height than the tunneling layer thickness. However, during retention, there is no large electric field present and so the loss of charge is more a function of the tunneling layer thickness than barrier height. To improve tunneling current for reduced operating voltages without sacrificing charge retention, in a particular embodiment, the tunneling layer 516 is a nitridized oxide. Nitridation increases the relative permittivity or dielectric constant ($\in$) of the tunneling layer by inducing nitrogen to an otherwise pure silicon dioxide film. In certain embodiments, the tunneling layer 516 of nitridized oxide has the same physical thickness as a conventional SONOS-type device employing pure oxygen tunnel oxide. In particular embodiments, nitridation provides a tunnel layer with an effective ($\in$) between 4.75 and 5.25, preferably between 4.90 and 5.1 (at standard temperature). In one such embodiment, nitridation provides a tunnel layer with an effective ($\in$) of 5.07, at standard temperature.

In certain embodiments, the nitridized tunnel oxide of the scaled SONOS device has the same physical thickness as a conventional, non-scaled SONOS device employing pure oxygen tunnel oxide. Generally, the higher permittivity of the nitridized tunnel oxide results in the memory layer charging faster. In such embodiments, the charge trapping layer 518 charges during program/erase faster than a pure oxygen tunnel oxide of that thickness because relatively less of the large electric field from the control gate is dropped across the nitridized tunnel oxide (due to the relatively higher permittivity of nitridized tunnel oxide). These embodiments allow the SONOS-type device 500 to operate with a reduced program/erase voltage while still achieving the same program/erase voltage threshold level (VTP/VTE) as a conventional SONOS-type device. In a particular embodiment, the SONOS-type device 500 employs a tunneling layer 516 having nitridized tunnel oxide with a physical thickness between 1.5 nm and 3.0 nm, and preferably between 1.9 nm and 2.2 nm.

Figure 6:
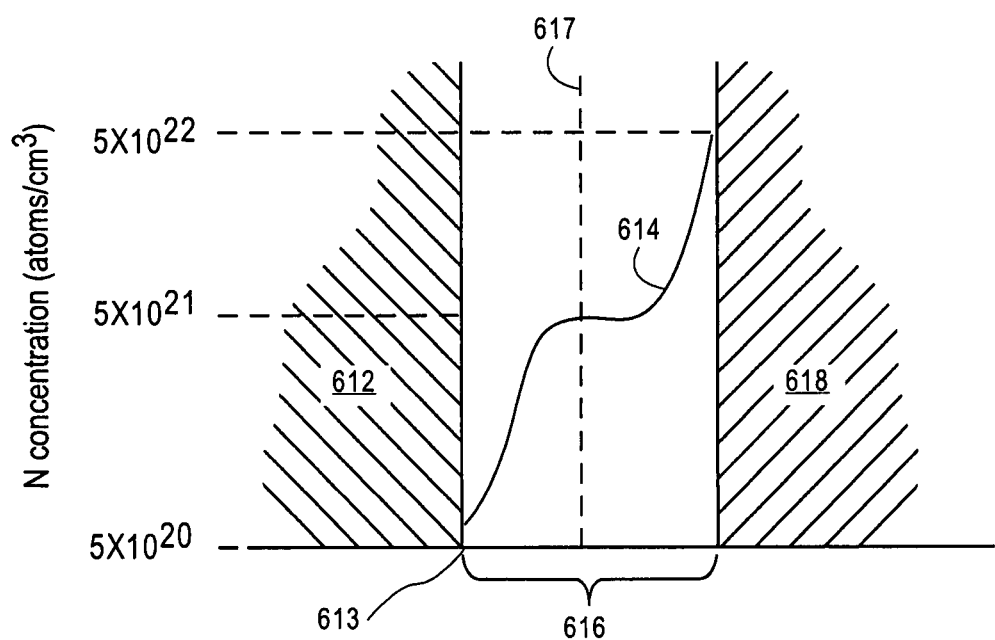
FIG. 6 illustrates an approximate nitrogen concentration profile of the nitridized oxide tunneling layer in accordance with an embodiment of the present invention.

In a further embodiment, the tunneling layer 516 is nitridized in a particular manner to reduce the trap density at the substrate interface to improve charge retention. For particular embodiments in which the nitridized oxide tunneling layer is scaled to be the same physical thickness as a pure oxygen tunnel oxide, charge retention may be approximately the same as the pure oxygen tunnel oxide of the same thickness. Referring to FIG. 6, depicting an approximate nitrogen concentration profile within one embodiment of the tunneling layer 616, the nitrogen concentration 614 decreases rapidly toward the substrate interface 613 to limit the formation of a silicon nitride ($Si_3N_4$) layer in contact with the substrate 612. A silicon nitride layer, comprising polar molecules, detrimentally increases the trap density if present at the substrate interface 613, thereby reducing charge retention via trap to trap tunneling. Thus, by adjusting the nitrogen concentration within the nitridized tunnel oxide, the programming/erase $V_{CG}$ may be reduced without a significant reduction in charge retention of the scaled SONOS device.

In one embodiment, nitridization of oxide within the tunneling layer reduces its energy barrier and increases the dielectric constant relative to a pure oxide tunneling layer. As shown in FIG. 5, tunneling layer 516 is annotated for illustration purposes with a centerline 517. FIG. 6 depicts a similar centerline 617 with one half the thickness of the tunneling layer 616 proximate the substrate 612 and one half the thickness of the tunneling layer 616 proximate the charge trapping layer 618. In a particular embodiment, the nitrogen concentration 614 is below $5 \times 10^{21}$ atoms/cm$^3$ throughout the first 25% of the thickness of the tunneling layer 616 and reaches approximately $5 \times 10^{21}$ atoms/cm$^3$ at 50% of the thickness of the tunneling layer 616, or at the centerline 617. In a further embodiment, the nitrogen concentration 614 is above $5 \times 10^{21}$ atoms/cm³ within the last 25% of the thickness of the tunneling layer 616, proximate the charge trapping layer 618. In an exemplary implementation, for a 2.2 nm tunneling layer, the nitrogen concentration 614 is below $5 \times 10^{21}$ atoms/cm³ within the first 0.6 nm of the tunneling layer proximate the substrate 612 and is at least $5 \times 10^{21}$ atoms/cm³ at 1.1 nm of the tunneling layer 616 thickness. In this manner, the capacitance of the tunneling layer may be increased without a significant reduction in charge retention of a scaled SONOS-type device.

FIG. 7 illustrates a graph depicting a simulation showing a reduction in programming voltage attributable to a nitridized oxide tunneling layer in accordance with an embodiment of the present invention. As shown, leakage current at retention voltages for 20 Å pure oxide tunneling layer and 40 Å nitride charge trapping layer is equal to 20 Å nitridized oxide tunneling layer and 40 Å charge trapping layer nitride, while charging current for the nitridized oxide tunneling layer at programming voltages is greater than that of the pure oxide tunneling layer. Thus, at a program or erase voltage of 9.1 V, a nitridized oxide tunneling layer in accordance with the present invention may provide the same program erase level achieved with a 10 V program or erase voltage and a conventional pure oxide tunneling layer.

Referring back to FIG. 5, the charge trapping layer 518 of the SONOS-type device 500 may further include any commonly known charge trapping material and have any thickness suitable to store charge and, modulate the threshold voltage of the device. In certain embodiments, charge trapping layer 518 is silicon nitride ($Si_3N_4$), silicon-rich silicon nitride, or silicon-rich silicon oxynitride. The silicon-rich film includes daggling silicon bonds. In one particular embodiment, the charge trapping layer 518 has a non-uniform stoichiometry across the thickness of charge trapping layer. For example, the charge trapping layer 518 may further include at least two oxynitride layers having differing compositions of silicon, oxygen and nitrogen. Such compositional nonhomogeneity within the charge trapping layer has a number of performance advantages over a conventional SONOS charge trapping layer having a substantially homogeneous composition. For example, reducing the thickness of the conventional SONOS charge trapping layer increases the trap to trap tunneling rate, resulting in a loss of data retention. However, when the stoichiometry of the charge trapping layer is modified in accordance with an embodiment of the present invention, the thickness of the charge trapping layer may be scaled down while still maintaining good data retention.

In a particular embodiment, the bottom oxynitride layer 518A provides a local region within the charge trapping layer having a relatively lower density of trap states, thereby reducing the trap density at the tunnel oxide interface to reduce trap assisted tunneling in the scaled SONOS device. This results in reduced stored charge loss for a given charge trapping layer thickness to enable scaling of the charge trapping layer for scaling of the ONO stack EOT. In one such embodiment, the bottom oxynitride 518A has a first composition with a high silicon concentration, a high oxygen concentration and a low nitrogen concentration to provide an oxygen-rich oxynitride. This first oxynitride may have a physical thickness between 2.5 nm and 4.0 nm corresponding to an EOT of between 1.5 nm and 5.0 nm. In one particular embodiment, the bottom oxynitride layer 518A has an effective dielectric constant ($\in$) of approximately 6.

In a further embodiment, a top oxynitride layer 518B provides a local region within the charge trapping layer having a relatively higher density of trap states. The relatively higher density of trap states enables a charge trapping layer of reduced thickness to provide sufficient trapped charge that the memory window remains adequate in the scaled ONO stack. Thus, the higher density of trap states has the effect of increasing the difference between programming and erase voltages of memory devices for a particular charge trapping layer thickness, allowing the charge trapping layer thickness to be reduced and thereby reducing the EOT of the ONO stack in the scaled SONOS device. In a particular embodiment, the composition of the top oxynitride layer has a high silicon concentration and a high nitrogen concentration with a low oxygen concentration to produce a silicon-rich, oxygen-lean oxynitride. Generally, the higher silicon content of the top oxynitride, the higher the density of trap states provided by the top oxynitride and the more the top oxynitride layer thickness can be reduced (thereby reducing the charge trapping layer thickness to enable lower voltage operation). Furthermore, the higher the silicon content, the greater the permittivity and the lower the EOT for the top oxynitride layer. This reduction in EOT may more than offset the increase in EOT of the oxygen-rich bottom oxynitride, for a net reduction in EOT of the charge trapping layer relative to conventional oxynitride charge trapping layers having a substantially homogeneous composition. In one such embodiment, the top oxynitride an effective dielectric constant of approximately 7.

Figure 7B:
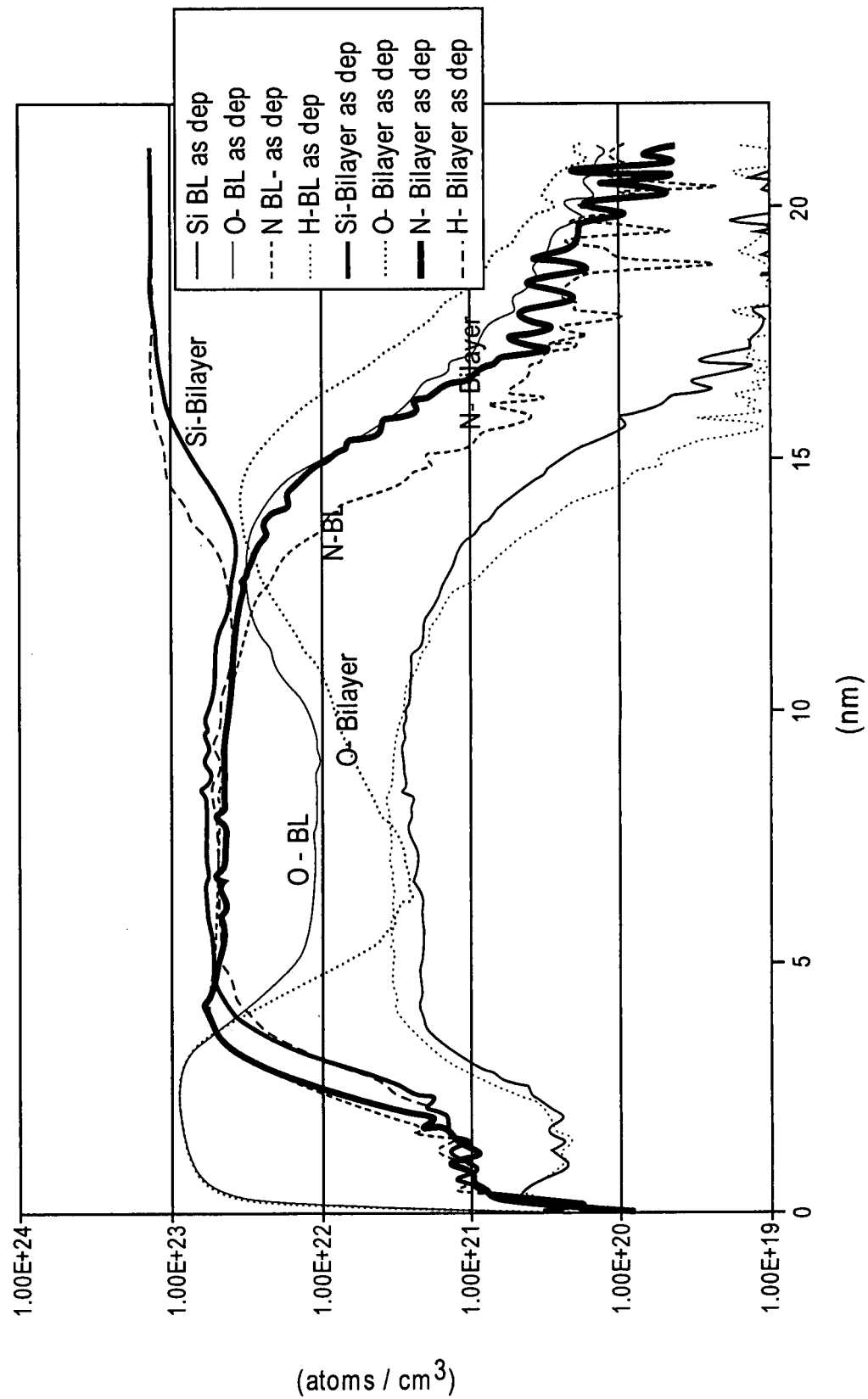
FIG. 7B illustrates a comparison of two concentration profiles of hydrogen, nitrogen, oxygen, and silicon in a blocking layer, charge trapping layer and tunneling layer of two different SONOS-type devices.

FIG. 7B depicts exemplary secondary ion mass spectroscopy (SIMS) profiles indicating the concentrations in atoms/cm³ of silicon (Si), nitrogen (N), oxygen (O) and hydrogen (H) after deposition (as-deposited) of a tunneling layer, charge trapping layer, and blocking layer. A base line condition ("BL") and a dual-layer oxynitride condition like that depicted in FIG. 5 ("Bilayer") are overlaid. The baseline condition has a conventional charge trapping layer with a homogenous composition. The x-axis represents the depth with 0 nm being at the exposed top surface of the blocking layer and proceeding through the stack from top down, terminating in the substrate. As shown, the oxygen concentration for the Bilayer condition is well below $1.0 \times 10^{22}$ atoms/cm³ in the depth region between approximately 5 nm and 10 nm, corresponding to a portion of the charge trapping layer. In contrast, the baseline condition displays a substantially higher oxygen concentration of greater than $1.0 \times 10^{22}$ within this same region. As further shown, the baseline condition has a substantially constant oxygen concentration between the 6 nm and 10 nm marks while the Bilayer condition shows substantially more oxygen near the 10 nm mark than the 6 nm mark. This non-uniformity in oxygen concentration represents the transition between the oxygen-lean top oxynitride and the oxygen-rich bottom oxynitride in the Bilayer condition.

In certain embodiments, the ratio of the bottom oxynitride layer thickness to the top oxynitride layer thickness is between 1:6 and 6:1, and more preferably at the ratio of bottom oxynitride thickness to top oxynitride thickness is at least 1:4. In an exemplary implementation where the first oxynitride has a physical thickness between 2.5 nm and 4.0 nm, the second oxynitride 518B has a physical thickness between 5.0 nm and 6.0 nm for a charge trapping layer 518 with a net physical thickness of between 7.5 nm and 10.0 nm. In one specific embodiment, employing a bottom oxynitride with a physical thickness of 30 Å, the top oxynitride has a physical thickness of 60 Å for a scaled charge trapping layer with a net physical thickness of 90 Å.

Figure 8A:
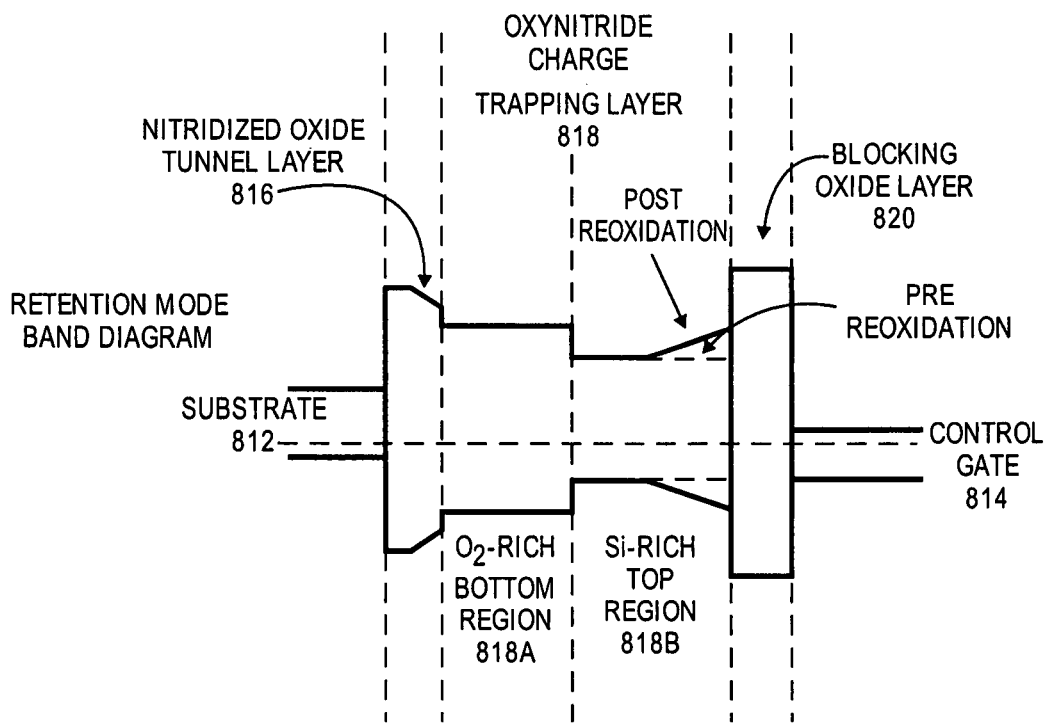
FIG. 8A depicts a retention mode energy band diagram of a scaled SONOS-type device in accordance with an embodiment of the present invention.
Figure 8B:
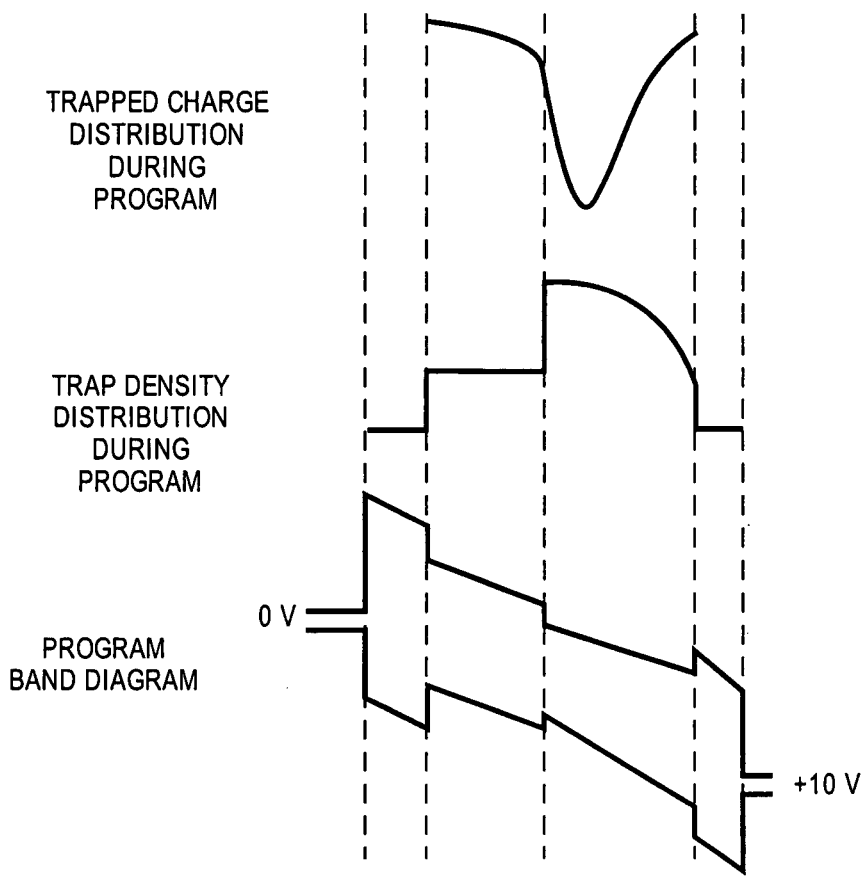
FIG. 8B depicts energy band diagram, trapped charge distribution and trap density distribution of a scaled SONOS-type device in accordance with an embodiment of the present invention during program.

In these particular embodiments, compositional nonhomogeneity is utilized to both locate and confine traps to an embedded locale of the charge trapping layer (i.e. concentrate the traps) a distance from the tunnel layer interface. FIG. 8A further illustrates an energy band diagram during retention of a scaled SONOS device including a nitridized tunnel oxide 816, a multi-layer charge trapping oxynitride 818 and a densified blocking layer 820 between a substrate 812 and control gate 814 according to an embodiment of the present invention. As depicted, the nonhomogeneity in the composition of the charge trapping layer 818 impacts both the valence and conduction bands between the silicon-rich top oxynitride 818B and oxygen-rich bottom oxynitride 818A of the charge trapping layer. As shown in FIG. 8B, the charge trapping layer in accordance with an embodiment the present invention provides a modulation in the bands at the interface of the oxygen-rich and silicon-rich oxynitride layers within the charge trapping layer 818. This band gap modulation serves to locate the trapped charge centroid within the top oxynitride layer, further away from the substrate for a given charge trapping layer thickness. The conduction band modulation between the oxynitride layers may also serve to reduce back streaming.

As further shown in FIG. 8A, a portion of the silicon-rich top oxynitride 818B is oxidized or reoxidized in a particular embodiment. Such an oxidation of the silicon-rich top region may produce a graded bandgap proximate to the blocking layer 820 relative to the pre-oxidation bandgap depicted as dashed lines for illustration purposes in FIG. 8A. In an embodiment, approximately half of the top oxynitride layer 818B is reoxidized to have a higher oxygen concentration toward the interface with the blocking layer 820. In another embodiment, substantially all of the top oxynitride layer 818B is reoxidized to have a higher oxygen concentration than as-deposited. In one embodiment, the reoxidation increases the oxygen concentration in the top oxynitride layer 818B by approximately $0.25 \times 10^{21}$-$0.35 \times 10^{21}$ atoms/cm$^3$. Such embodiments employing a reoxidized charge trapping layer may prevent trap migration to the interface between the charge trapping layer and the blocking layer, thereby allowing the charge trapping layer thickness to be reduced without incurring the charge retention penalty associated with thinning a charge trapping layer of substantially homogeneous composition. Preventing the charge from migrating to the blocking oxide layer also reduces the electric field across the blocking oxide during erase which reduces the back streaming of electrons, or to allow scaling down the blocking oxide while maintaining the same level of electron back streaming. Such trap location and confinement provided by the regions of distinct stoichiometry in the charge trapping layer and as further combined with reoxidation of a portion of the charge trapping layer in particular embodiments may enable a scaled SONOS device in accordance with the present invention to operate at a reduced voltage or with faster program and erase times while maintaining good memory retention.

Although depicted in the figures and described elsewhere herein as having only two oxynitride layers, i.e., a top and a bottom layer, the present invention is not so limited, and the multi-layer charge storing layer can include any number, n, of oxynitride layers, any or all of which having differing compositions of oxygen, nitrogen and/or silicon. In particular, multi-layer charge storing layers having up to five oxynitride layers of differing compositions have been produced and tested.

As further depicted in FIG. 5, the blocking layer 520 of the ONO stack 504 includes a layer of silicon dioxide between about 30 Å and about 50 Å. Scaling of the blocking layer 520 in the ONO stack of the SONOS-type device is non-trivial because if done improperly can detrimentally increase back streaming of carriers from the control gate under certain bias conditions. In one embodiment including a partially reoxidized charge trapping layer, the blocking layer 520 is a high temperature oxide (HTO) which is relatively denser than as-deposited. A densified oxide has a lower fraction of terminal hydrogen or hydroxyl bonds. For example, removal of the hydrogen or water from an HTO oxide has the effect of increasing the film density and improving the quality of the HTO oxide. The higher quality oxide enables the layer to be scaled in thickness. In one embodiment, the hydrogen concentration is greater than $2.5 \times 10^{20}$ atoms/cm$^3$ as deposited and is reduced to below $8.0 \times 10^{19}$ atoms/cm$^3$ in the densified film. In an exemplary embodiment, the thickness of the HTO oxide is between 2.5 nm and 10.0 nm as-deposited and anywhere between 10% and 30% thinner upon densification.

In an alternate embodiment, the blocking oxide layer is further modified to incorporate nitrogen. In one such embodiment, the nitrogen is incorporated in the form of an ONO stack across the thickness of the blocking oxide layer. Such a sandwich structure in place of the conventional pure oxygen blocking layer advantageously reduces the EOT of the entire stack between the channel and control gate as well as enable tuning of band offsets to reduce back injection of carriers. The ONO block layer can then be incorporated with the nitridized tunnel oxide and charge trapping layer comprising a bottom oxynitride layer and a top oxynitride layer.

Over the ONO stack 504 is a gate layer 514. The gate layer 514 may be any conductor or semiconductor material. In one such embodiment, the gate layer 514 is poly-silicon (poly). In another embodiment, the gate layer 514 contains a metal, such as, but not limited to, hafnium, zirconium, titanium, tantalum, aluminum, ruthenium, palladium, platinum, cobalt and nickel, their silicides, their nitrides and their carbides. In one particular embodiment, the gate layer 514 is poly-silicon having a physical thickness of between 70 nm and 250 nm.

As further shown in FIG. 5, the SONOS-type device 500 includes a gate cap layer 525 super adjacent to the gate layer 514 and has approximately the same critical dimensions as the gate layer 514 and ONO stack 504. In certain embodiments, the gate cap layer 525 forms the top layer of the gate stack 502 and provides a hard mask during patterning of the gate layer 514 and ONO stack 504. In some embodiments, the gate cap layer 525 facilitates formation of self aligned contacts (SAC) to the SONOS devices. The gate cap layer 525 may be comprised of any material capable providing the necessary selectivity to subsequent etch processes, such as, but not limited to, silicon dioxide, silicon nitride, and silicon oxynitride.

In one specific embodiment, a SONOS-type device employs an ONO stack including a nitridized tunnel oxide with an EOT of 14 Å corresponding to a physical thickness of approximately 18 Å, a charge trapping layer comprising a bottom oxynitride layer with an EOT of 20 Å corresponding to a physical thickness of approximately 25 Å and a top oxynitride layer with an EOT of 30 Å corresponding to a physical thickness of approximately 60 Å, and a blocking oxide layer deposited to 40 Å and densified to 30 Å. Such a SONOS-type device may be operated at a voltage range of approximately 9 V, to provide an initial erase voltage threshold level (VTE) of −2 V after a 1 ms to 10 ms pulse.

Figure 9:
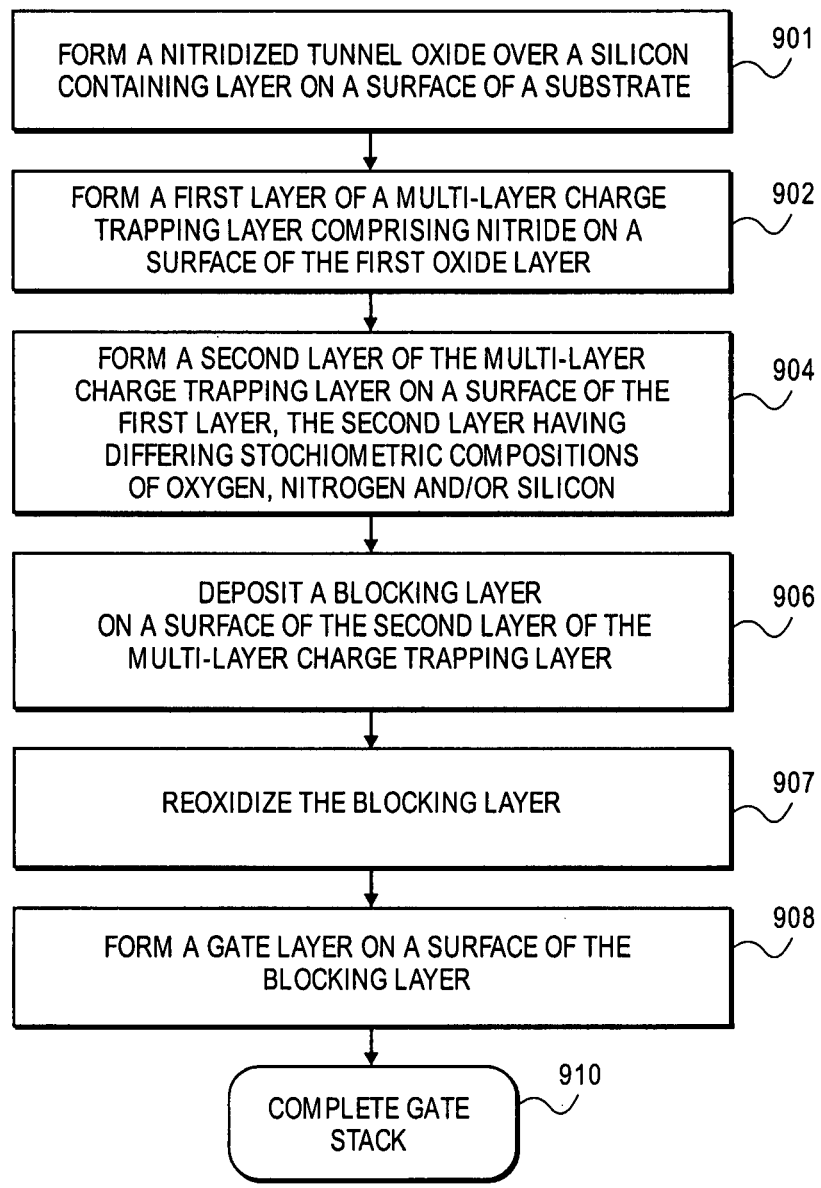
FIG. 9 is a flow chart of a SONOS scaling method of fabricating a scaled ONO structure including a nitridized oxide tunneling layer, a multi-layer charge trapping layer and a reoxidized blocking layer according to an embodiment of the present invention.
Figure 10:
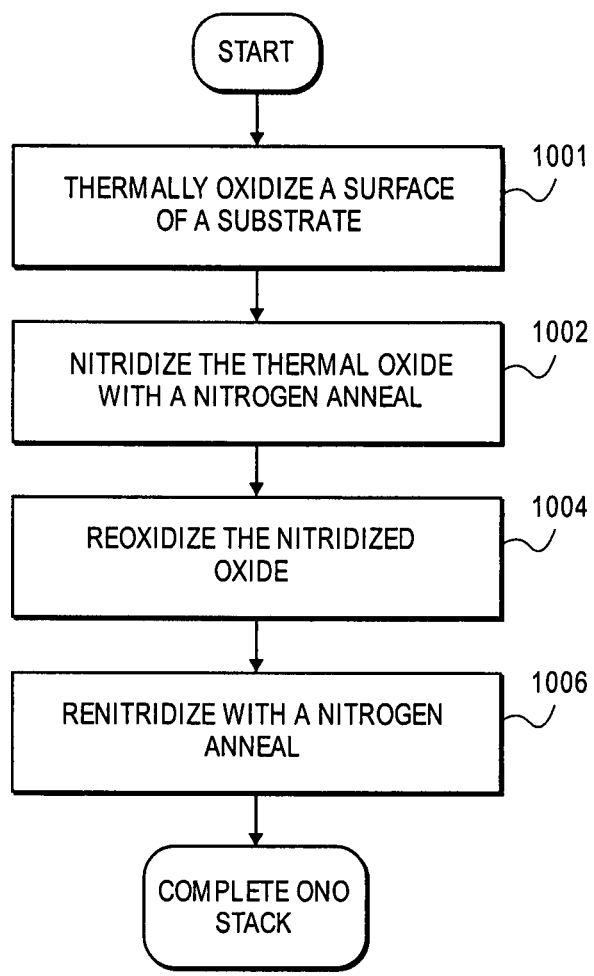
FIG. 10 is a flow chart of a SONOS scaling method of forming a nitridized oxide tunneling layer.

FIG. 9 depicts a flow chart of a method for fabricating a scaled SONOS, such as that depicted in FIG. 5, including a nitridized oxide tunneling layer, a multi-layer charge trapping oxynitride that has been partially reoxidized and a densified blocking oxide layer, as described above. The fabrication method of FIG. 9 begins with forming a nitridized oxide tunneling layer over a silicon-containing surface of a substrate at operation 900. FIG. 10 depicts a flow chart of specific method for forming the nitridized oxide of operation 900 in FIG. 9.

In the embodiment depicted in FIG. 10, tailoring of the nitrogen profile in the nitridized tunnel oxide of a SONOS-type device is accomplished with a multi-step nitridation and oxidation method. At operation 1001, a thin thermal oxide is formed from a silicon containing layer on a surface of a substrate, such as substrate 508 of FIG. 5. Because a good interface with the substrate is necessary, formation of a chemical oxide may preface the thermal oxidation. In a particular embodiment, therefore, a chemical oxide is present during the thermal oxidation (as opposed to performing a conventional "HF last" pre-clean). In one such embodiment, the chemical oxide is grown with ozonated water to form a chemical oxide layer with a thickness of approximately 1.0 nm.

The thermal oxide is formed to a thickness of between approximately 1.0 nm and 1.8 nm. In a particular embodiment, the thermal oxide is formed to a thickness of between 1.0 nm and 1.2 nm. Thus, in embodiments where a 1.0 nm chemical oxide is present during the thermal oxidation of operation 501, the thickness of the surface oxide does not substantially increase, however the quality of the oxide is improved. In a further embodiment, the oxide is of relatively low density to facilitate subsequent incorporation of a significant wt % of nitrogen. Too low of a film density, however, will result in too much nitrogen at the silicon substrate interface. Formation of the silicon dioxide layer at operation 501 further serves as a means to block additional substrate oxide formation during subsequent thermal processing, discussed further below. In one embodiment, an atmospheric pressure vertical thermal reactor (VTR) is employed to grow the thermal oxide at a temperature between 680° C. and 800° C. in the presence of an oxidizing gas such as, oxygen ($O_2$), nitrous oxide ($N_2O$), nitric oxide (NO), ozone ($O_3$), and steam ($H_2O$). Depending on the oxidizer chosen, the oxidation of operation 1001 may be from 3.5 minutes to 20 minutes in duration. In one atmospheric embodiment, employing $O_2$ gas at a temperature between 700° C. and 750° C., a process time between 7 minutes and 20 minutes forms an approximately 1.0 nm silicon dioxide film.

In another embodiment, the oxidation operation 1001 is performed with a sub-atmospheric processor such as the Advanced Vertical Processor (AVP) commercially available from AVIZA technology of Scotts Valley, Calif. The AVP may be operated in the temperature range described above for a VTR embodiment and at a pressure between 1 Torr (T) and atmospheric pressure. Depending on the operating pressure, the oxidation time to form a thermal silicon dioxide film of between approximately 1.0 nm and 1.8 nm in thickness may extend up to nearly an hour, as may be determined by one of ordinary skill in the art.

Next, at operation 1002 in the multiple oxidation nitridation method embodiment depicted in FIG. 10, the thermal oxide formed at operation 1001 is nitridized. Generally, at operation 1002, a nitrogen anneal is performed to increase the dielectric constant ($\kappa$) and reduce the fixed charge of the thermal oxide layer. In one embodiment, the nitrogen anneal employs nitrogen ($N_2$) or a hydrogenated nitrogen source, such as ammonia ($NH_3$). In another embodiment, the nitrogen anneal employs a deuterated nitrogen source, such as deuterated ammonia ($ND_3$). In one specific embodiment, the nitrogen anneal is performed at a temperature between 700° C. and 850° C. for between 3.5 minutes and 30 minutes. In another specific embodiment, the nitrogen anneal is performed at a temperature between 725° C. and 775° C., for between 3.5 minutes and 30 minutes. In one such embodiment, $NH_3$ is introduced at atmospheric pressure at a temperature of between 725° C. and 775° C., for between 3.5 minutes and 30 minutes. In an alternative embodiment, a sub-atmospheric $NH_3$ anneal is performed at 800° C. to 900° C. for 5 minutes to 30 minutes in a processor such as the AVP. In still other embodiments, commonly known nitrogen plasma and thermal anneal combinations are performed.

Following operation 1002, a reoxidation is performed at operation 1004. In one embodiment, during the reoxidation process, an oxidizing gas is thermally cracked to provide oxygen radicals close to the film surface. The oxygen radicals eliminate nitrogen and hydrogen trap charge. The reoxidation operation 1002 also grows an additional oxide at the substrate interface to provide a physical offset between the substrate and a nitrogen concentration within the tunneling layer. For example, referring back to FIG. 5, the reoxidation helps to separate the substrate interface 513 from a nitrogen concentration within the tunneling layer 516. As specifically shown in FIG. 6, for one implementation, the nitrogen concentration 614 in the tunneling layer 616 at the substrate interface 613 is significantly below $5 \times 10^{21}$ atoms/cm$^3$ and may be on the order of $5 \times 10^{20}$ atoms/cm$^3$. This offset in the nitrogen from the substrate interface improves retention of a SONOS-type device. In one embodiment, the thickness of the oxide grown at the substrate interface 613 is limited to between 1.2 nm and 3.0 nm. At operation 1004, the reoxidation process conditions are chosen such that the thickness of the thermal oxide formed at operation 1001 prevents oxidation beyond a thickness of approximately 3.0 nm, which could render a tunneling layer devoid of any advantageous nitrogen concentration. Commonly known oxidizers may be employed for the reoxidation process, such as, but not limited to, NO, $N_2O$, $O_2$, $O_3$ and steam. Any such oxidizers may be introduced with known thermal processors operating at a temperature of between 800° C. and 850° C. Depending on the operating parameters, reoxidation time may be anywhere between 5 minutes and 40 minutes. In a particular embodiment, NO is employed in an atmospheric furnace operated at a temperature between 800° C. and 850° C. for a process time of approximately 15 minutes to form a nitridized oxide film that is approximately 2.2 nm in thickness on a silicon substrate. In one such embodiment, the reoxidized film 2.2 nm thick forms a region between 0.5 nm and 0.8 nm proximate to the interface with the silicon substrate, the region having a nitrogen concentration below $5 \times 10^{21}$ atoms/cm$^3$.

Following the reoxidation of operation 1004, a second nitrogen anneal is performed at operation 1006 to renitridize the tunneling layer. A second nitrogen anneal is employed to further increase the dielectric constant of the tunneling layer without detrimentally introducing a large number of hydrogen or nitrogen traps at the substrate interface. In one embodiment, the second nitrogen anneal of operation 1006 is performed with conditions identical to the anneal performed in operation 1002. In another embodiment, the second nitrogen anneal of operation 1006 is performed at a higher temperature than the first nitrogen anneal of operation 1002 to introduce additional nitrogen into the tunneling layer. In one embodiment, the nitrogen anneal employs a hydrogenated nitrogen source, such as $NH_3$. In another embodiment, the nitrogen anneal employs a deuterated nitrogen source, such as $ND_3$. In a specific embodiment, the nitrogen anneal of operation 1006 employs $NH_3$ at atmospheric pressure and a temperature between 750° C. and 950° C. with a processing time of between 3.5 minutes and 30 minutes. In another particular embodiment, the $NH_3$ anneal is performed at atmospheric pressure between 800° C. and 850° C. for between 5 minutes and 10 minutes.

As described, operations 1001 through 1006 depicted in FIG. 10 provide two oxidation operations and two nitridation operations. The iterative oxidation, nitridation scheme depicted enables specific tailoring of the nitrogen concentration in the tunneling layer to achieve both a reduction in programming voltage or increase in programming speed and an increase in memory retention of a SONOS-type device. The successive nature of the oxidation, nitridation, reoxidation, renitridation operations 1001-1006 enable an appreciable nitrogen concentration in a tunneling layer less than 3.0 nm thick while providing an interface between the tunneling layer and the substrate that has very little nitrogen and hydrogen traps. The independent oxidation, nitridation, reoxidation, renitridation operations 1001-1006 enable the first and second oxidations and first and second nitridation to be performed with independently engineered conditions to provide greater degrees of freedom in tailoring the nitrogen concentration profile in a tunneling layer. In one advantageous embodiment, operation 1001, 1002, 1004 and 1006 are successively performed in a single thermal processor without removing the substrate from the processor between operations. In one such embodiment, process pressure is held at atmosphere for operations 1001-1006. First, oxidation operation 1001 is performed at a temperature of between 700° C. and 750° C. Gas flows are then modified as prescribed to perform the nitrogen anneal of operation 1002 at a temperature between 725° C. and 775° C. The furnace temperature is then ramped up to between 800° C. and 850° C. and gas flows are again modified to perform the reoxidation of operation 1004. Finally, while holding the furnace between 800° C. and 850° C., gas flows are again modified to perform the second nitrogen anneal of operation 1006.

With the nitridized oxide tunneling layer 516 of FIG. 5 substantially complete, fabrication of the ONO stack may continue by returning to the method depicted in FIG. 9. In one embodiment, multiple nitride or oxynitride charge trapping layers are formed at operations 902 and 904 in a low pressure CVD process using a silicon source, such as silane ($SiH_4$), dichlorosilane ($SiH_2Cl_2$), tetrachlorosilane ($SiCl_4$) or Bis-TertiaryButylAmino Silane (BTBAS), a nitrogen source, such as $N_2$, $NH_3$, $N_2O$ or nitrogen trioxide ($NO_3$), and an oxygen-containing gas, such as $O_2$ or $N_2O$. Alternatively, gases in which-hydrogen has been replaced by deuterium can be used, including, for example, the substitution of $ND_3$ for $NH_3$. The substitution of deuterium for hydrogen advantageously passivates Si dangling bonds at the substrate interface, thereby increasing an NBTI (Negative Bias Temperature Instability) lifetime of SONOS-type devices.

In one exemplary implementation, an oxynitride charge trapping layer can be deposited at operation 902 over a tunneling layer by placing the substrate in a deposition chamber and introducing a process gas including $N_2O$, $NH_3$ and DCS, while maintaining the chamber at a pressure of from about 5 millitorr (mT) to about 500 mT, and maintaining the substrate at a temperature of from about 700° C. to about 850° C. and more preferably at least about 780° C., for a period of from about 2.5 minutes to about 20 minutes. In a further embodiment, the process gas can include a first gas mixture of $N_2O$ and $NH_3$ mixed in a ratio of from about 8:1 to about 1:8 and a second gas mixture of $SiH_2Cl_2$ and $NH_3$ mixed in a ratio of from about 1:7 to about 7:1, and can be introduced at a flow rate of from about 5 to about 200 standard cubic centimeters per minute (sccm). It has been found that an oxynitride layer produced or deposited under these condition yields a silicon-rich oxygen-rich, oxynitride layer, such as the charge trapping layer 518A depicted in FIG. 5. Formation of the charge trapping layer may further involve a CVD process at operation 904 employing a first gas mixture of $N_2O$ and $NH_3$ mixed in a ratio of from about 8:1 to about 1:8 and a second gas mixture of $SiH_2Cl_2$ and $NH_3$ mixed in a ratio of from about 1:7 to about 7:1, introduced at a flow rate of from about 5 to about 20 sccm to yield a silicon-rich, nitrogen-rich, and oxygen-lean oxynitride layer, such as the charge trapping layer 518B depicted in FIG. 5.

In one embodiment, formation of a charge trapping layer at operations 902 and 904 is performed sequentially in the same processing tool used to form the tunneling layer without unloading the substrate from the deposition chamber between operations 901 and 904. In a specific embodiment, the charge trapping layer is deposited without altering the temperature at which the substrate was heated during the second nitrogen anneal of operation 1006 of FIG. 10. In one embodiment, the charge trapping layer is deposited sequentially and immediately following nitridation of the tunneling layer at operation 901 by modifying the flow rate of $NH_3$ gas, and introducing N2O and $SiH_2Cl_2$ to provide the desired gas ratios to yield either a silicon-rich and oxygen-rich layer, a silicon-rich and nitrogen-rich oxynitride layer, or both layers in a dual-layer implementation.

Following operation 904, a blocking layer can be formed at operation 906 by any suitable means including, for example, thermal oxidation or deposition with CVD techniques. In a preferred embodiment, the blocking layer is formed with a high-temperature CVD process. Generally, the deposition process involves providing a silicon source, such as $SiH_4$, $SiH_2Cl_2$, or $SiCl_4$ and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 650° C. to about 850° C. Preferably, the blocking layer is deposited sequentially in the same processing tool employed to form the charge trapping layer(s) at operations 902 and 904. More preferably, the blocking layer is formed in the same processing tool as is both the charge trapping layer(s) and the tunneling layer without removing the substrate between operations.

In the embodiment depicted in FIG. 9, the blocking layer deposited at operation 906 is reoxidized at operation 908 to density the blocking layer oxide. As discussed elsewhere herein, operation 908 may further oxidize or reoxidize a portion or all of the charge trapping layer, such as a portion or all of the charge trapping layer 518B shown in FIG. 5 to achieve a graded band gap, such as depicted in FIG. 8A. Generally, the reoxidation may be performed in the presence of an oxidizing gas such as, oxygen ($O_2$), nitrous oxide ($N_2O$), nitric oxide (NO), ozone ($O_3$), and steam ($H_2O$). In one embodiment, the reoxidation process may is performed at a higher temperature than the temperature at which the blocking layer is deposited. Reoxidation after the deposition of the blocking oxide enables a more controlled diffusion of oxidizer to controllably oxidize or reoxidize the thin charge trapping layer. In a particularly advantageous embodiment, a dilute wet oxidation is employed. The dilute wet oxidation is distinct from a wet oxidation in that the $H_2:O_2$ ratio is between 1 and 1.3. In one specific embodiment, a dilute oxidation with an $H_2:O_2$ ratio of approximately 1.2 is performed at a temperature of between 800° C. and 900° C. In a further embodiment, the duration of the dilute oxidation may be sufficient to grow between 5.0 nm and 12.5 nm of silicon dioxide on a silicon substrate. In one such embodiment, the duration is sufficient to for an approximately 10 nm to 1.1 nm silicon dioxide layer on a silicon substrate. Such a dilute oxidation process serves to reoxidize the deposited blocking layer oxide and may further oxidize or reoxidize a portion of the charge trapping layer to impart a band structure like that depicted in FIG. 8A or 8B. In another embodiment, the reoxidation of operation 908 may further serve to form a gate oxide in a non-SONOS-type device region, such as for a complementary metal oxide silicon (CMOS) field effect transistors (FET), on the same substrate as the SONOS-type device. In another embodiment, the reoxidation of operation 908 may further serve to diffuse deuterium into portions of the charge trapping layer or blocking layer of the SONOS-type device.

As depicted in FIG. 9, the method may then be completed at operation 910 with formation of a gate layer, such as the gate layer 514 of FIG. 5. In certain embodiments, operation 910 may further include formation of a gate cap layer, such as gate cap layer 525 depicted in FIG. 5. With the completion of the gate stack fabrication, further processing may occur as known in the art to conclude fabrication of the SONOS-type device 300.

Although the present invention has been described in language specific to structural features and/or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

What is claimed is:

1. A method of fabricating a nonvolatile trapped-charge memory device, comprising:
    forming a tunneling layer on a substrate, wherein forming the tunneling layer comprises oxidizing the substrate to form an oxide film and nitridizing the oxide film;
    forming a multilayer oxynitride charge trapping layer on the tunneling layer comprising an oxygen-rich bottom layer and an oxygen-lean top layer;
    depositing a blocking layer on the charge trapping layer;
    densifying the blocking layer with an oxidizing anneal, wherein the oxidizing anneal oxidizes at least a portion of the oxygen-lean top layer of the multilayer oxynitride charge trapping layer, the oxidized portion proximate to the blocking layer and equal to approximately one half of the oxygen-lean top layer; and
    forming a gate layer on the densified blocking layer.

2. The method of claim 1, wherein densifying the blocking layer further comprises exposing the blocking layer to a dilute wet oxidation having a H2:02 ratio between approximately 1 and 1.3.

3. The method of claim 2, wherein the dilute wet oxidation is performed at a temperature between approximately 800° C. and approximately 900° C.

4. The method of claim 1, wherein forming the oxynitride charge trapping layer comprises depositing at least one silicon-rich, oxygen-lean oxynitride layer and wherein densifying the blocking layer comprises oxidizing a portion of the silicon-rich, oxygen-lean oxynitride layer proximate to the blocking layer less than an entire thickness of the silicon-rich, oxygen-lean oxynitride layer.

5. The method of claim 1, wherein forming the oxynitride charge trapping layer further comprises:
    depositing at least one oxygen-rich oxynitride layer; and
    depositing at least one silicon-rich, oxygen-lean oxynitride layer on the at least one oxygen-rich oxynitride layer.

6. The method of claim 5, wherein densifying the blocking layer comprises oxidizing a portion of the silicon-rich, oxygen-lean oxynitride layer proximate to the blocking layer less than an entire thickness of the silicon-rich, oxygen-lean oxynitride layer.

7. The method of claim 5, wherein the silicon-rich, oxygen-lean oxynitride is deposited at a temperature between approximately 700° C. to approximately 850° C. with a process gas comprising a first mixture of at least N20 and NH3 in a ratio of from about 8:1 to about 1:8 and a second gas mixture comprising SiH2Cl2 and NH3 mixed in a ratio of from about 1:7 to about 7:1 introduced at a flow rate of from approximately 5 sccm to approximately 20 sccm.

8. The method of claim 1, wherein forming the tunneling layer further comprises:
    reoxidizing the nitridized oxide film; and
    renitridizing the reoxidized nitridized oxide film.

9. The method of claim 8, wherein oxidizing the substrate includes exposing the substrate to 02 and wherein reoxidizing includes exposing the substrate the nitridized oxide film to NO.

10. The method of claim 8, wherein the tunneling layer, the charge trapping layer and the blocking layer are each formed successively in the same processing tool at a temperature between approximately 700° C. and approximately 850° C.

11. A method of fabricating a nonvolatile trapped-charge memory device, comprising:
    loading a substrate into a thermal processing tool;
    forming an ONO stack on the substrate, the ONO stack comprising a tunneling layer on the substrate, a charge trapping layer on the tunneling layer, and a blocking layer on the charge trapping layer, wherein forming the tunneling layer comprises oxidizing the substrate to form an oxide film and nitridizing the oxide film;
    unloading the substrate from the thermal processing tool;
    patterning the ONO stack to expose a portion of a silicon surface of the substrate;
    densifying the blocking layer of the ONO stack and forming a gate oxide layer on the exposed portion of the silicon surface of the substrate with a dilute wet oxidation having a H2:02 ratio between approximately 1 and approximately 1.3, wherein densifying the oxide blocking layer oxidizes at least a portion of an oxygen-lean top layer of a multilayer oxynitride charge trapping layer of the ONO stack, the oxidized portion proximate to the blocking layer and equal to approximately one half of the oxygen-lean top layer; and
    depositing a gate layer on the densified blocking layer and on the gate oxide layer.

12. The method of claim 11, wherein a tunneling layer of the ONO stack is no greater than 3.0 nm thick, the blocking layer is no greater than 7.5 nm thick and the gate layer is no greater than 12.5 nm thick.

13. The method of claim 11, wherein a process temperature of the dilute wet oxidation is greater than the highest process temperature employed for formation of the ONO stack.

* * * * *